United States Patent
Lepejian

[19]

[11] Patent Number: 6,154,714
[45] Date of Patent: Nov. 28, 2000

[54] METHOD FOR USING WAFER NAVIGATION TO REDUCE TESTING TIMES OF INTEGRATED CIRCUIT WAFERS

[75] Inventor: David Yepejian Lepejian, Palo Alto, Calif.

[73] Assignee: Heuristic Physics Laboratories, San Jose, Calif.

[21] Appl. No.: 08/971,424

[22] Filed: Nov. 17, 1997

[51] Int. Cl.⁷ .................................................. G06F 19/00
[52] U.S. Cl. .............................. 702/118; 702/81; 700/121
[58] Field of Search ................... 702/81, 82, 83, 702/84, 118; 700/109, 110, 121

[56] References Cited

U.S. PATENT DOCUMENTS

| | | | |
|---|---|---|---|
| 4,706,019 | 11/1987 | Richardson | 324/751 |
| 5,030,907 | 7/1991 | Yih et al. | 324/754 |
| 5,751,582 | 5/1998 | Saxena et al. | 364/468.16 |
| 5,777,901 | 7/1998 | Berezin et al. | 364/578 |
| 5,822,218 | 10/1998 | Moosa et al. | 364/488 |
| 5,844,803 | 12/1998 | Beffa | 364/468.28 |
| 5,907,492 | 5/1999 | Akram et al. | 364/468.28 |
| 5,915,231 | 6/1999 | Beffa | 702/118 |
| 5,923,553 | 7/1999 | Yi | 364/468.17 |
| 5,946,213 | 8/1999 | Steffan et al. | 364/468.17 |
| 5,946,214 | 8/1999 | Heavlin et al. | 364/468.28 |
| 5,963,881 | 10/1999 | Kahn et al. | 702/35 |
| 5,978,751 | 11/1999 | Pence et al. | 702/179 |
| 5,986,950 | 11/1999 | Joseph | 365/200 |
| 5,991,699 | 11/1999 | Kulkarni et al. | 702/83 |

*Primary Examiner*—Patrick Assouad
*Attorney, Agent, or Firm*—Sierra Patent Group, Ltd.

[57] ABSTRACT

A method for testing an integrated circuit wafer is described, wherein the wafer has a first plurality of dice defined thereon, and at least one die has at least one known defect. The method comprises the steps of selecting for testing a first die having a known defect; analyzing connectivity information and defect information relating to the first die, determining, based upon the analysis, a probability of failure for each known defect on the first die, and modifying the sequence of tests performed on the first die so that at least one test which directly relates to a known defect is performed prior to performing tests which are unrelated to a defect.

15 Claims, 5 Drawing Sheets

METHOD FOR USING WAFER NAVIGATION TO REDUCE TESTING TIMES OF INTEGRATED CIRCUIT WAFERS

BACKGROUND OF THE INVENTION

1. Field of the Invention

This invention relates to the field of integrated circuit testing. More particularly, the present invention describes a method for using wafer navigation while testing integrated circuits in order to reduce the overall testing times of integrated circuits.

2. Background

It is common practice in the manufacturing of integrated circuits (IC's) to test the functionality of circuits on the silicon wafer prior to the wafer being divided into smaller, individual dice for packaging. Dice that are identified during a test as having a fatal defect are tagged, either by physically placing a drop of ink on the defective dice or by setting a flag in a test data base, so that the defective dice are rejected prior to the packaging process.

Improvements in integrated circuit technology have resulted in the gradual increase in the overall size of individual wafers and the dramatic decrease in the die area required to perform a given function. Thus, greater numbers of more complex circuits are now present on each wafer. For example, the number of bits stored in a leading edge Dynamic Random Access Memory (DRAM) has increased about a thousand times over the past fifteen years.

As integrated circuit technology has evolved, manufacturing and inspection techniques have been developed for improving the yield of good dice and for identifying the physical origins of failures. The desire to develop these technical improvements has been largely driven by a reduction in physical dimensions and increase in integrated circuit complexity that rendered earlier inspection techniques ineffective. Two advances that are particularly relevant to the present invention will now be described.

The first advance relates to the identification of physical defects. For a number of years this inspection was performed by operators using microscopes. The information gained from these inspections is then used to make process adjustments and to rework individual wafers in attempts to repair observed defects.

As the feature size on integrated circuit dice has shrunk, individual defects that were large enough to affect circuit functionality has become more difficult to observe with a microscope. In addition, the number of features to be observed has increased exponentially with time, thus overburdening the inspection personnel. Thus, automated inspection techniques were introduced as a replacement.

Inspection stations utilizing automated inspection techniques generally depend upon optical techniques which allow inspection of large areas of the wafer simultaneously in order to provide high throughputs which decreases the cost of inspection per layer per wafer.

These inspection stations are computer controlled and are capable of generating reports on defect density by defect size by process layer inspected for each wafer inspected. This information, together with the location of the defects, is stored in a large data base which is used with statistical techniques to provide feedback to manufacturing personnel. This feedback might indicate when to perform maintenance operations or when a manufacturing tool is out of statistical control and consequently in need of intervention by a technician.

A second advance in technology that has been developed is navigation for failure analysis. For Large-Scale Integrated (LSI) circuitry, finding the location of an identified defect is not difficult. For example, an LSI memory of 1 Kbit capacity typically has 32 rows and 32 columns, the intersection of each row and column containing a memory cell. If a memory cell located on the ninth row and seventeenth column fails, it is a relatively simple task to find the failing cell by counting the rows and columns.

In comparison, an Ultra Large-Scale Integrated (ULSI) memory of 16 Mbit capacity typically has 4096 rows and 4096 columns, with each intersection of a row and a column containing a memory cell. If a failure were to occur on the cell located at the intersection of row 1247 and column 2783, for example, locating the cell by manually counting rows and columns would be extremely tedious and prone to error.

To overcome this problem, software that finds an identified location on a die from known fiducial marks by using the information from the layout data base was developed. This software is commonly referred to as navigation software by analogy with a map. Commonly, a wafer is mounted on a movable stage that allows precision adjustment of the displacement so that a defect that has been identified can be placed at the center of the field of view of an optical microscope or scanning electron microscope so that a failing location can be closely inspected or so that detailed electrical testing of the failing location, often referred to as microprobing, can be carried out.

Despite improvements in testing techniques, the time needed to test each die has increased significantly, and the equipment required to perform the test has increased in sophistication, resulting in a significant increase in testing costs. In order to reduce testing costs, techniques such as parallel testing and design for test have been developed. In spite of these cost reduction efforts, the overall cost of testing continues to increase.

Although these advances in testing methodology have somewhat reduced the time and effort required to test circuits disposed on a silicon wafer, significant time is still spent in determining whether any identified defect on the wafer is fatal to any given die. It would therefore be beneficial to provide a method for testing integrated circuits which significantly reduces the testing time over the prior art, thus providing greater throughput.

OBJECTS AND ADVANTAGES OF THE INVENTION

It is an object and advantage of the present invention to provide a method for testing integrated circuits which significantly reduces the testing time over the prior art.

It is a further object and advantage of the present invention to provide a method for analyzing the effect of an identified defect on the acceptability of a die which utilizes historical test data and historical inspection data to determine a probability that a given defect will result in a test failure.

It is a third object and advantage of the present invention to provide a method for controlling the testing of integrated circuits so that dice having a high probability of failure are rejected from the testing process prior to any testing steps being performed.

It is a fourth object and advantage of the present invention to provide a method for controlling the of testing integrated circuits which dynamically reorders the testing steps responsive to the probability that a particular test related to an identified defect will weed out a fatal defect early in the testing process.

SUMMARY OF THE INVENTION

A method for testing an integrated circuit wafer is described, the wafer having a plurality of dice defined thereon, and at least one die has at least one known defect. The method comprises the steps of selecting for testing a first die having a known defect; analyzing connectivity information and defect information relating to the first die, determining, based upon the analysis, a probability of failure for each known defect on the first die, and modifying the sequence of tests performed on the first die so that at least one test which directly relates to a known defect is performed prior to performing tests which are unrelated to a defect.

DESCRIPTION OF A PREFERRED EMBODIMENT

Those of ordinary skill in the art will realize that the following description of the present invention is illustrative only and is not intended to be in any way limiting. Other embodiments of the invention will readily suggest themselves to such skilled persons from an examination of the within disclosure.

The present invention combines the capabilities of the advances described earlier with new analysis tools to significantly reduce the average time to test each wafer. By reducing the testing time, the production cost is reduced, thus increasing testing throughput and lowering the overall cost of each wafer.

Briefly, when a die on a wafer is presented for testing, an inspection database is queried to determine if there are known defects on the die. If so, the connectivity of the circuitry on the die is analyzed using information about each defect to determine whether any given defect will be fatal. If the probability is high that a defect is fatal to the functionality of the die, the die may be removed from the testing queue without further analysis.

If, however, the probability of a defect being fatal is marginal, further analysis may be made using historical test data, historical inspection data, and/or using other inspection equipment such as a scanning electron microscope, as necessary.

If, after analyzing the available data, it is still not clear whether a given defect is causing a fatal malfunction, critical testing steps relating to the defect may be performed prior to other testing steps. If those testing steps pass, tests relating to the next lower probability defect are performed, and so on, until all known defects on a die have been tested. At any time a fatal malfunction is identified, testing on that die is terminated, and the die may then be rejected.

In order to determine a probability that a particular defect will cause a fatal failure, data is collected over time for each defect and for relevant tests that are performed on each die within each wafer. As each die on each wafer is processed, results are stored which identify the type and category of the defect, the particular wafer involved, etc., so that this information may be used to create a probability that any given defect will be fatal, resulting in the rejection of the die.

With sufficient data, some defects on dice in high volume manufacturing facilities may be determined to have a high enough probability of causing a fatal malfunction that it is economically beneficial to reject the dice containing these defects without any electrical testing at all.

Figure 1:
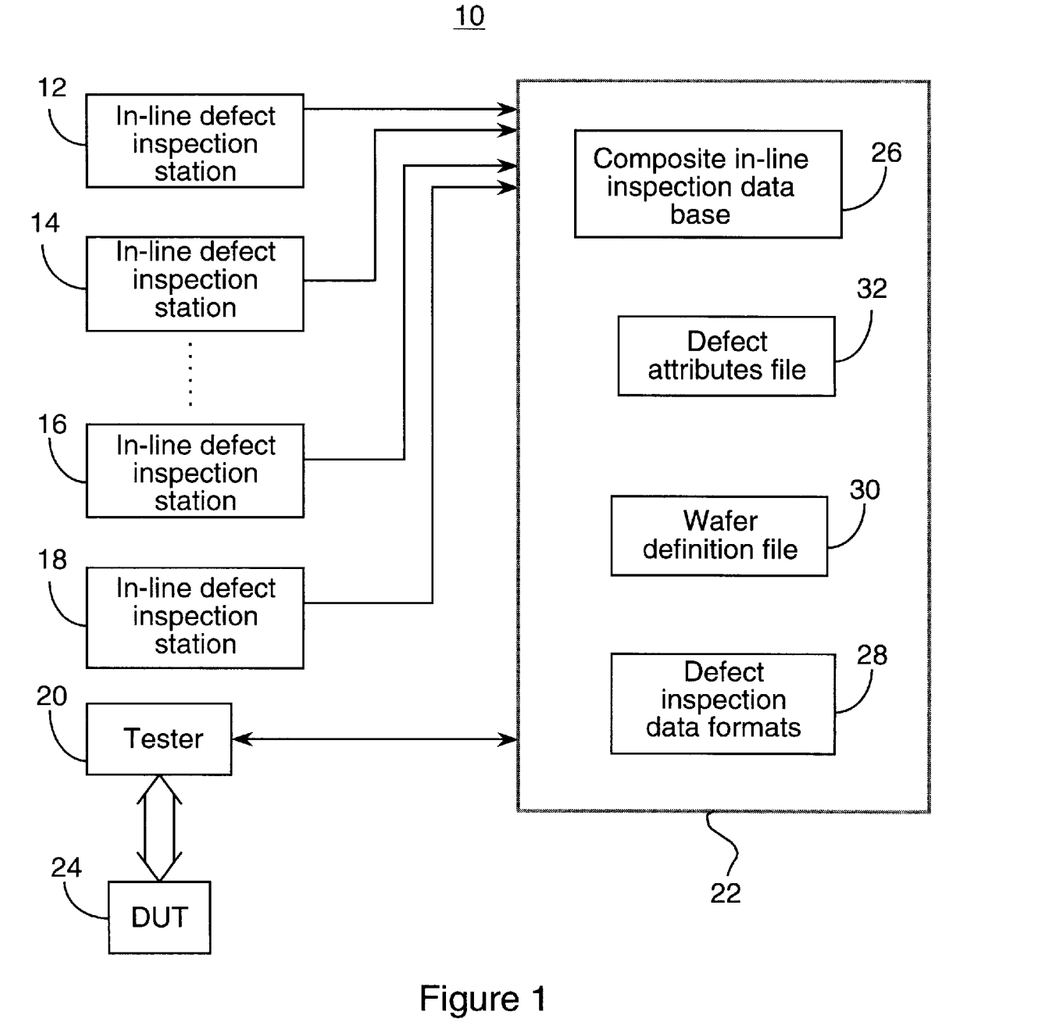
FIG. 1 is an overall block diagram of a system in accordance with the teachings of this invention.

FIG. 1 is an overall block diagram of a defect processing system in accordance with a presently preferred embodiment of the present invention.

Referring to FIG. 1, defect processing system 10 is shown having in-line defect inspection stations 12, 14, 16, and 18, test station 20, and data processing system 22. Although four inspection stations 12, 14, 16, and 18 are shown, any number of inspection stations may be utilized as the needs of the particular manufacturing facility dictate. Shown also is Device Under Test (DUT) 24 which represents a wafer being tested at test station 20.

In a preferred embodiment of the method of the present invention, a wafer being processed in a Physical Vapor Deposition (PVD), Chemical Vapor Deposition (CVD), or other wafer processing system will occasionally be directed to one or more of inspection stations 12, 14, 16, and 18 so that the wafer may be inspected to detect defects which may have occurred during the manufacturing process.

Once a wafer is examined, data corresponding to any detected defects is either stored by the individual inspection station 12, 14, 16, or 18 which detected the defect, or transmitted to processing system 22 for storage in database 26. Database 26 may contain one large file, or many smaller files segregated by wafer number, layer number, category, type, or any other convenient criteria depending on the needs of the particular manufacturing environment. The actual layout of the data is not as important as the use of the data described herein.

Although it is most efficient to regularly transmit the data from each inspection station to a central processing location such as database 26, it is also possible to hold a predetermined amount of data at each inspection station 12, 14, 16, and 18, interrogating each station as required to download data when necessary to perform a defect analysis.

Because the equipment at each of inspection stations 12, 14, 16, and 18 may vary depending on the type of inspection being performed, the data collected by each station may vary in content and formatting. In order to ensure that inspection data is interpreted correctly, data processing system 22 uses defect inspection data formats file 28 which sets forth the type, content, and formatting of data available at each station. Alternatively, data being transmitted from each inspection station 12, 14, 16, or 18 may be translated, using a software or hardware data converter, into a common format used by database 26.

One example of differing data formats involves the coordinates of a defect. Different inspection equipment may describe the location of a defect using different coordinate systems. In order for the data to be useful when performing the analysis steps in the method of the present invention, it will be necessary to standardize the coordinate systems for all data required for an analysis. Numerous techniques for file format and coordinate transformation are well known to those of ordinary skill in the art.

In the coordinate system preferred by the inventor, the wafer is "viewed" in relation to a flat/notch up position with the top-left most die being the 0,0 die, or "origin" of the coordinate system. The coordinates of all the defects are transformed from the coordinate systems used at each inspection station 12, 14, 16 or 18 into a wafer relative scheme in which all defect coordinates are measured relative to the wafer origin in coordinates of x and y.

Data transmitted by the inspection stations 12, 14, 16, and 18 will also contain such details about defects such as wafer identification data (so each defect will be identified with a particular wafer), defect location (in x, y coordinates), the size of the defect, etc. The defect's location may be measured die relative, i.e. the coordinates of the defect are measured from the die origin (typically the top-left corner), or may be measured relative to the origin of a coordinate system on the wafer.

In addition to using current and historical defect data, a presently preferred embodiment of the present invention uses a wafer definition file 30 which contains GDSII and other information regarding the definition of functional blocks, the size and placement of functional blocks within a die, and the size, orientation, and placement of dice on the wafer, etc. For example, in a Ultra-Large Scale Integrated (ULSI) dynamic random access memory containing an array of 16 Mbits of memory space, the basic functional block is a memory cell. This memory cell, as well as other necessary circuitry such as decoders, sense amplifiers, etc., is repeated as necessary to form a 1024 column×1024 row, 1 Mbit memory array. Sixteen of these memory arrays are then placed within each die. It is common to have many such dice existing on each silicon wafer.

Although wafer definition file 30 is shown residing on data processing system 22, those of ordinary skill in the art will readily recognize that this file and other files used in the method of the present invention may reside on any media in any location, such as on an engineering desktop computer, a networked mainframe computer, or any other location, so long as the file is available when needed to process and analyze the defect data.

Using wafer definition file 30 and the location (in x,y or other coordinate system) of identified defects, the defects can be filtered by die and by the subregion of a die where the defect is located. Entries in database 26 for any given die contain a list of attributes for each noted defect, including the defect's location, size, and layer of detection.

If desired, the defects on a die can be further filtered according to the subsection of the die. To use the 16 Mbit example above, this die is composed of 16 arrays, each containing 1024 columns and 1024 rows. Identified defects relating to a particular memory cell may be indexed by a set of indices, the location of the die on the wafer, the location of the particular memory cell within the die, and the micron coordinates measured relative to the functional block where the defect is located.

A third file used by a presently preferred embodiment of the present invention is a defect attributes file 32 which is a knowledge base which contains the results of experience with manufacturing using a particular integrated circuit process. Information gathered during failure analysis of defects detected at inspection stations 12, 14, 16, and 18 is used to compile a historical knowledge base that contains information relating to all identified defects. Attributes important to the practice of the present invention include: the probability of a defect being conductive, the probability of the defect "evaporating" before causing a failure (i.e. subsequent processing results in the defects being removed), the variation in actual size based on the measured size, the variation in actual location based on the measured location, likely failure mechanisms and failure signatures for particular defects, and testing scenarios most likely to detect the failure mechanism of particular defects.

Recall that inspection data is collected at various stages in the manufacturing process. Thus, at any given step in the manufacturing process, identified defects may be present which will have been detected after a given layer of metal or other material has been deposited on the wafer. The attributes and defect data collected includes the analysis of when in the manufacturing process a defect was detected, the significance attached to a defect being detected at a given step in the manufacturing process, and whether one defect may have lead to the creation of additional defects.

The known information relating to particular defects present on a wafer to be tested is analyzed against historical data using wafer definition file 30 to help determine whether conductive paths are likely to be interfered with as a result of the defect being created. Using this information, the probability of a defect causing an electrical failure is computed.

Not all defects on a wafer will give rise to electrical failures. Some defects will occur in areas on the wafer where they will not affect the electrical behavior of the circuit.

Figure 2:
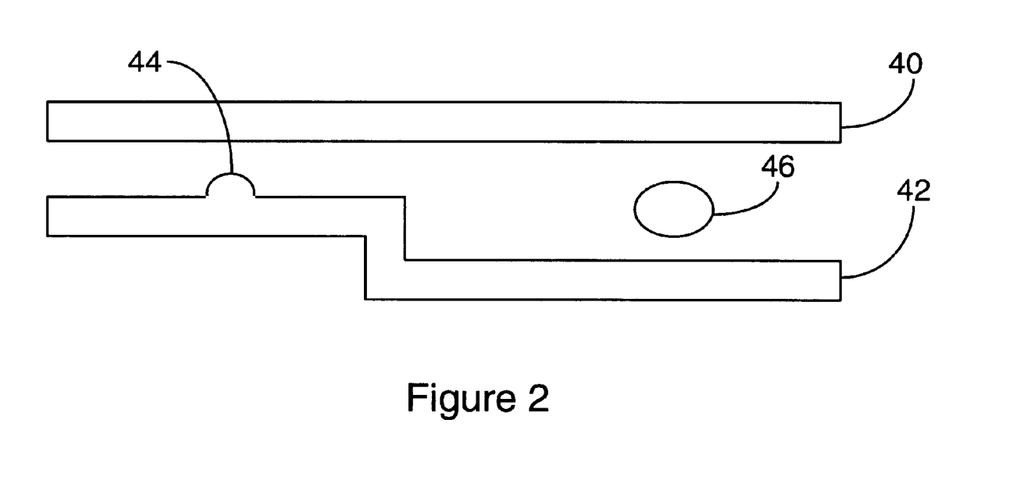
FIG. 2 is a layout diagram of a typical defect which will not result in an electrical failure.

FIG. 2 is a layout diagram of typical defects which will not result in an electrical failure.

Referring to FIG. 2, conductive paths 40 and 42 represent conducting metal layers that are not designed to be connected together. Regions 44 and 46 represent areas of unintended metal remaining on the wafer after a metal etch processing step. Neither of these regions 44 or 46 cause an unintended connection between paths 40 and 42, and thus are termed "non-fatal" defects. If either of these defects were large enough that paths 40 and 42 were caused to be connected, the region 44 or 46 which connected them would be designated a fatal defect.

The analysis to determine whether defects are fatal can be done without electrical testing using only geometrical information. However, this will often lead to a false positive identification of fatal defects.

Figure 3:
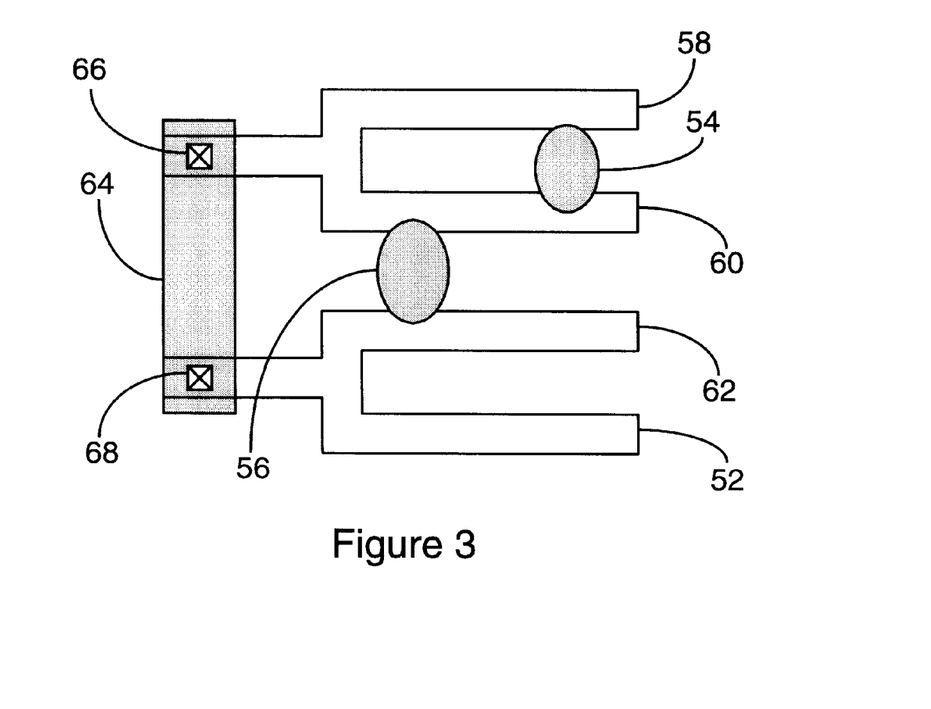
FIG. 3 is a layout diagram depicting defects which cause bridging between traces.

FIG. 3 is a layout diagram depicting defects which cause bridging between traces.

Referring to FIG. 3, conductive paths 50 and 52 represent portions of a metal layer such as the metal-1 or metal-2 layers known to those of ordinary skill in the art. Defects 54 and 56, if comprised of conducting material, have the potential of electrically connecting the two neighboring traces, thus causing one or more "bridging" faults. The determining factor of whether a bridging fault would occur is whether those neighboring traces are designed to be connected at some other location on the die. If the traces are not designed to be connected at any location, a bridging fault exists.

For example, because the two portions 58 and 60 of path 50 are designed to be connected together near the reference designation 50, defect 54 causes a non-fatal bridge between portions 58 and 60 of path 50. Because the bridge does not connect two traces that otherwise would not be connected, there is no bridging fault.

A second example involves portion 60 of path 50, and portion 62 of path 52. Here, if region 64 is a trace on an upper layer (isolated from the lower layer by a dielectric) which connects paths 50 and 52 at contact points 66 and 68 respectively, defect 56 will be a nonfatal defect. However, if region 64 were not there, defect 56 would, in this second example, be fatal. This is because paths 50 and 52 are not designed to be connected, but the unintentional conductive defect 56 has connected them. Thus, whether a defect causes a fault depends not only on the defects size and location, but also on its conductivity and upon the connectivity of the traces that are potentially affected.

An algorithm that eliminates, without further analysis, defects that connect portions of the same conducting trace would falsely identify defect 54 of FIG. 3 as a fatal defect. To properly analyze whether a defect is fatal, it is necessary to utilize the entire connectivity of each die so that all traces that form a common electrical node can be identified. This operation is called net extraction.

There are at least three strategies that can be employed for net extraction. The first strategy is to perform a global extraction, i.e. to extract the connectivity for the entire integrated circuit, before any other analysis is done, and store the resultant net list for later use. In this first approach, the wafer definition file is processed to extract all nets by reading in a net list file such as a SPICE file or by direct extraction from the GDSII file. The extraction of all nets results in a connectivity graph of the design. This first approach can take a lot of computer time for a large circuit, but may be preferred in those cases In which it is expected that the resultant net list will be employed extensively over an extended period of time so that the initial time expenditure can be amortized over many analyses.

A second similar approach, called local net extraction, is to perform a number of extractions over the individual circuit subsections, such as on the level of each individual die. This has two advantages over the first approach. One advantage is that the extraction time increases quadratically with the number of nodes. The other advantage is seen when using repeated functional blocks as in the sixteen memory subarrays described earlier, where knowledge of the connectivity of one functional block may be used to reduce the time to extract other identical arrays. The disadvantage of this second approach is the difficulty with keeping track of the connectivity across the boundaries where the individual subarrays meet.

A third approach, developed by the inventor and termed dynamic extraction, uses the identified defects as a guide to what information needs to be extracted from the wafer definition file. When a defect is identified as possibly affecting a particular geometry on the circuit, the connectivity of that particular geometry is extracted for one time use during the time that a particular defect is being analyzed. This third approach is preferred in cases in which any circuit is expected to be analyzed over a limited amount of time as is often the case in the manufacture of application specific integrated circuits.

Once the connectivity has been determined using any of the three approaches described above or any other reasonable approach, the probability of an identified defect altering this connectivity graph is computed using the defect's location and size information. Recall that location and size information has been previously provided by the inspection equipment or defect management system, and the defect attributes introduced by the knowledge base.

The wafer definition file is "viewed" at different stages of the manufacturing process of the particular wafer allowing the defects detected at a particular process step to be analyzed with the design at that particular point in the process. For example, defects detected at the inspection point which follows the deposition of the "Metal-1 Post CMP" layer are placed within a layout file that contains all layers deposited prior to and including "Metal-1 Post CMP". All the defects at an inspected step are placed within the layout file using the location and size information provided by the inspection stations 12, 14, 16, or 18 of FIG. 1.

Defect attributes provided by the knowledge base are included in the analysis of the defects. For example, if the defects detected within a given layer have a high probability of being non-conductive, they are more likely to cause "breaks", whereas defects that have a high probability of being conductive are more likely to cause bridges. In addition, defects detected between certain steps in the manufacturing process may have a high probability of "evaporating".

According to a preferred embodiment of the method of the present invention, the variation of defect sizes and locations within a given layer are used in computing the failure probability. The defects can be analyzed using +/−A % of their detected size and +/−B % of their detected location. When comparisons are made between historical defects and the defect being analyzed, weights are assigned to each of the historical defects, depending upon the relative similarities between any given defects.

Each defect is "added" to the layout as a polygon with its positional and knowledge based derived attributes to determine if its introduction can cause a change to the net list.

Figure 4:
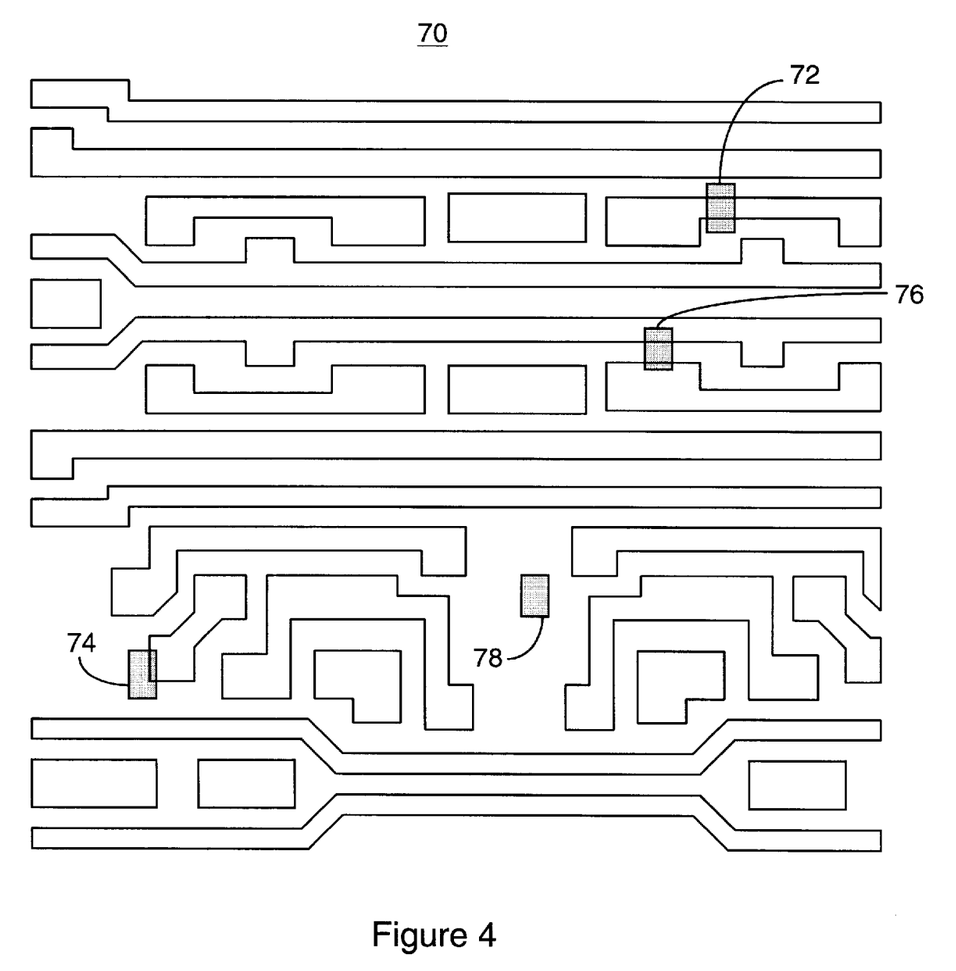
FIG. 4 is a layout diagram depicting one layer of an typical integrated circuit containing various defects.

FIG. 4 is a layout diagram depicting one layer of a typical integrated circuit containing various defects.

Referring to FIG. 4, layout 70 shows defects 72, 74, 76 and 78 detected following the deposition of the metal-1 layer. The enclosed figures without shading are the outlines of the metal 1. The defects 72 and 74 are nonconductive, and defects 76 and 78 are conductive. Defect 72 can lead to a break in a conductive path, while defect 76 would more likely cause a bridge. Defects 76 and 78 would likely not be involved in an electrical failure.

Figure 5A:
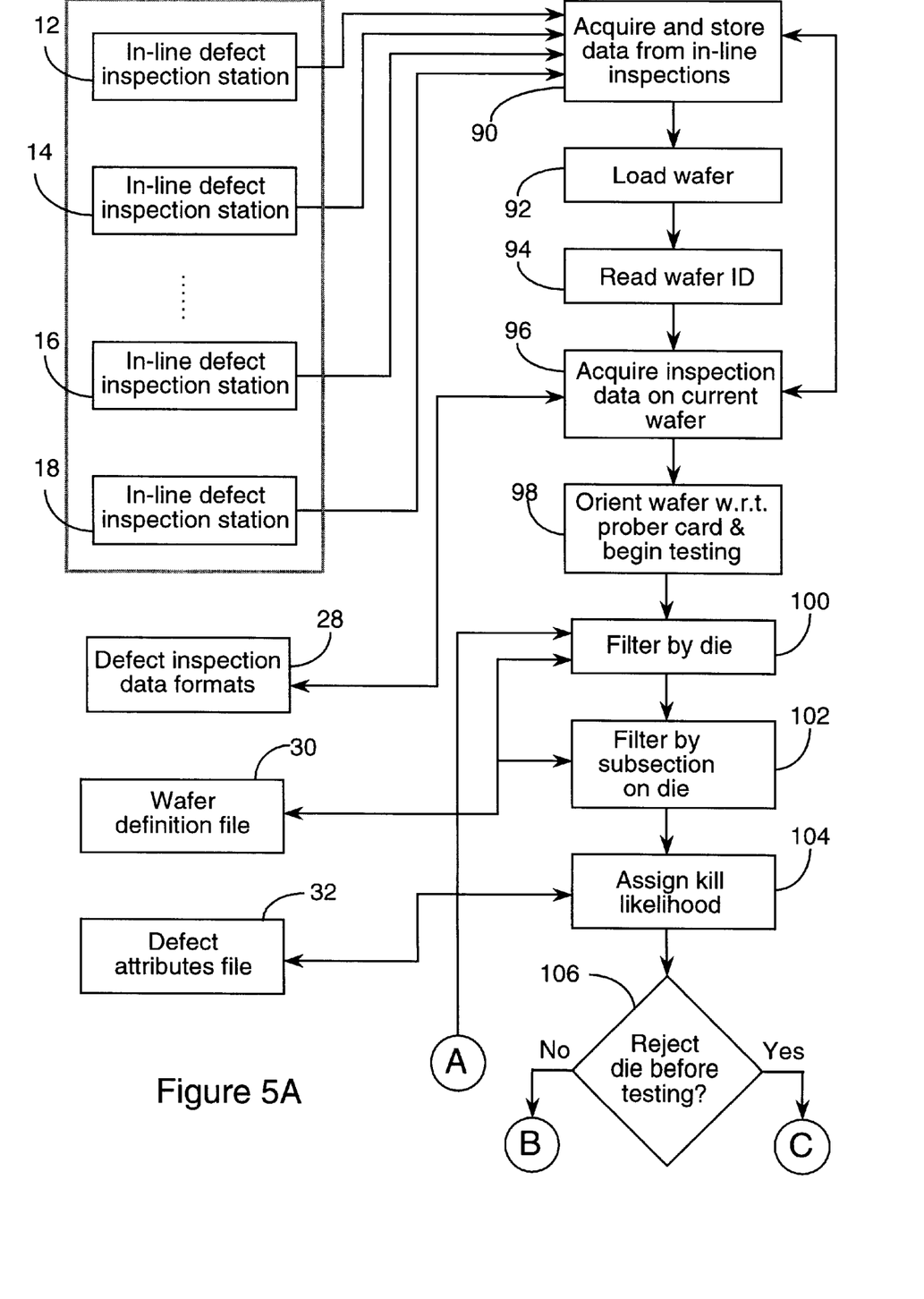
FIG. 5A is a flowchart depicting steps in the preferred method of the present invention.
Figure 5B:
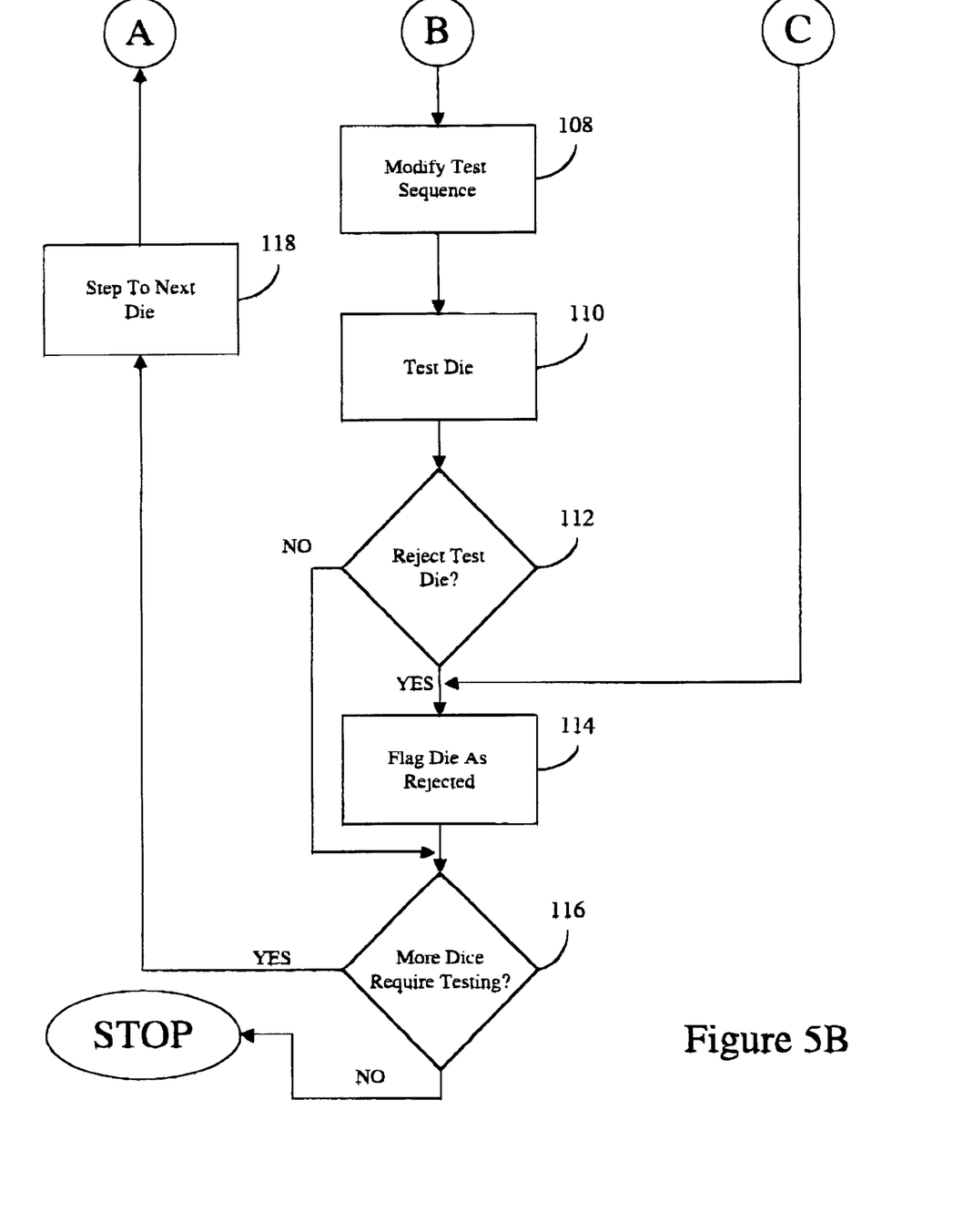
FIG. 5B is a flowchart further depicting steps in the preferred method of the present invention.

FIG. 5A and FIG. 5B show a flowchart depicting steps in the preferred method of the present invention.

Referring to FIG. 5A, at step 90, inspections are performed by in-line defect inspection stations 12, 14, 16, and 18 as required by the particular manufacturing scenario. As stated earlier, the data may stored locally at each inspection station, or may be transmitted periodically to a common storage and processing system such as processing system 22 in FIG. 1.

At step 92 a wafer to be tested is loaded into the test station, and at step 94 wafer identification data is read by the tester off of the wafer.

At step 96, previous inspection data for the wafer may be loaded into active memory for use in analyzing whether defects are fatal. Recall that if the data is held locally at each of inspection stations 12, 14, 16, or 18, it may be necessary at this time to load defect inspection data formats file 28 so that the organization of the data available on a given inspection station may be known. Alternatively, if the data is transmitted periodically to a common storage location, a translation may be performed at the time the transmittal occurs so that all data in the common storage location will be in a common format.

At step 98, the wafer is oriented on the tester using a flat edge on the circular wafer as a guide. Recall that coordinates of defects present on the wafer are established in relation to the flat edge. By orienting the wafer with respect to this edge, the wafer tester may readily identify the location of each die to be tested. After orienting the wafer, a die is chosen for testing.

At step 100, defect information for the wafer being tested is filtered by the die containing the defect. Recall that defect data is typically in X, Y coordinates, and that wafer definition file is needed to determine which die a defect affects. The wafer definition file relates the physical wafer coordinates to each die and subsection of each die. If there is no defect information relating to the die chosen for testing, the method of the present invention doesn't apply to that die, and testing proceeds in the normal fashion.

It is contemplated by the inventor that steps 98 and 100 may be performed in either order, since the order of performance is not critical. It will be readily seen by those of ordinary skill in the art that other steps in the method may be performed in other orders than specified herein, without departing from the scope and purpose of the present invention.

At step 102 the data is further filtered by the subsection of the die being tested so that an analysis may be made using connectivity information for that particular subsection. Recall that the inventor has developed a technique for dynamic extraction of the connectivity information so that only the portions of the connectivity information which directly relates to the defect being tested is extracted.

At step 104, the defect data is analyzed using the connectivity information. If that information is not determinative, further analysis may be performed using historical defect data and historical test data.

This analysis of the defects results in each defect having a probability of causing failure. The probability is computed based on the attributes derived from the knowledge base, positional attributes, and the interaction of the defect with the layout.

The results of all of this analysis is the knowledge, prior to the initial functional test for each die on a wafer, of the subsections that are most likely to fail. There are several strategies in which this knowledge can be applied to reduce or eliminate testing time. A first strategy is to reorder testing steps so that tests directly relating to the subsection of the die having the highest probability of failure are performed prior to tests for other sub-sections having lower probabilities of failure. A second strategy is to eliminate from testing, those dice which have been determined to contain fatal defects.

The approach that is chosen depends upon the reliability of the defect analysis, the cost of testing, and the value of the die. For instance, if the cost of testing is low, but the cost of the die being tested is high, it is often more cost effective to test a marginal die rather than reject it prior to testing. If the cost of testing is high but the die is inexpensive to manufacture, the die may be rejected more readily.

At step 106, it is determined whether the analysis has resulted in a rejection of the die prior to testing. If no, the defect may only marginally affect the connectivity, and it is necessary to perform tests in order to determine whether the die is acceptable. In this case, the method proceeds with step 108 in FIG. 5B where the test sequence is reordered so that tests relating to the defect are performed prior to any other tests.

Using the 16 MB DRAM example, if a particular subsection of the die containing a defect has the greatest likelihood of failure, as determined using historical data, and as compared to other subsections containing defects, the test sequence is ordered to begin testing in that subsection having the highest probability of failure. If the testing passes, other testing may take place, with the steps of testing being ordered in relation to decreasing probabilities of locating a failure, based on particular defects. If any test fails, further testing of the die may be terminated, saving upwards of 90% on testing time.

An alternative embodiment contemplated by the inventor would extend the technique to even smaller blocks. If a particular location within sub-section 5 (for example, column 12 row 96) is more likely to fail as compared to other locations within sub-section 5, the testing within subsection 5 can begin at column 12 row 96 or the sub-subsection that contains that specific memory address.

In addition to the location of a defect that has a high probability of failure, the information relating to each defect may specify particular tests they are likely to fail, so the sequence of tests can also be altered at the time a die is tested so that the desired tests may be run prior to any other testing.

Because human intervention would be devastating to the desired throughput seen in modern wafer fabrication facilities, it is intended that the order of the tests be reorganized automatically. However, not all test systems have the capability to implement the techniques described herein.

For example, logic testers commonly used in the testing of integrated circuits function by executing a series of test vectors stored in the testers memory. Reordering the sequence of tests may require reloading the tester's vector memory, which may take several minutes, thus destroying the objective sought to be achieved by implementing the present invention. In these cases, it is important to identify the dice on the wafer that have the same subsections most likely to fail first. If it is assumed that the die can be divided into 10 major sub-sections and that there are 200 dice per wafer, the dice on the wafer can be separated into 10 groups, with each group having a preferred test sequence. The number of dice in each group will vary depending on defect locations. The test system would then cause the wafer prober to first test all of the dice that fall into group 1, then group 2, etc., until all groups have been tested. Although it might be necessary to reload the vector memory between groups, the loading time would be amortized over, on the average, 20 dice within each group.

The order in which the groups are tested could also be established to minimize the amount of the memory that must be reloaded and, hence, the reloading time.

A second alternative to having a tester which does not have the capability of quickly reordering the sequence of testing is to choose a single test sequence that is expected to yield the shortest test time for a given die, given the expected defects on that die. This optimum test sequence might vary from wafer to wafer, but for any wafer the sequence could be optimized.

As the learning on a process technology and circuit design progresses, the greatest time savings will be when there are classes of defects that are so likely to cause the circuit to fail that it is economically beneficial to reject the dice with no testing.

At step 110, the die is tested using the test sequence established in step 108. At step 112, it is determined if the die should be rejected based upon tests which have failed minimum standards of acceptability. In this step, all test results are considered whether they related to known defects or not.

It will be readily apparent to those of ordinary skill in the art that a failure of any tests performed at step 108 may result in an automatic rejection of a die, even though the failed test may not have related to a failure. It is contemplated by the inventor that testing may be halted at any time the die is determined to be rejectable, so that valuable testing time is not wasted while testing a die that will not result in higher production yields.

If, in step 112, the die is rejected, the die is flagged, marked, or otherwise rejected in step 114. In step 116, it is determined whether there are any more dice on this wafer that require testing. If yes, the method proceeds with step 118 where the tester moves to the next die to be tested, and resumes the method of the present invention at step 100.

If, in step 116, there are no further dice on this wafer that require testing, the method terminates.

If, in step 106 in FIG. 5A, the die was rejected prior to testing, the method proceeds with step 114 in FIG. 5B, thus bypassing testing steps and improving throughput.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. A method for testing an integrated circuit wafer, the wafer having a plurality of dice defined thereon, at least one die having at least one known defect, as determined by inspection, the method comprising the steps of:

selecting for testing a first die having a known defect;

analyzing connectivity information and defect information relating to said first die;

determining, based upon said analysis of said connectivity information and said defect information, a probability of failure for each known defect on said first die; and modifying the sequence of tests performed on said first die so that at least one test which directly relates to a known defect is performed prior to performing tests which are unrelated to a defect.

2. The method of claim 1 wherein said step of analyzing is further defined as including the steps of:

dynamically extracting net list information for at least one circuit relating to a defect being analyzed; and determining at least one conductive path likely to be impaired by the at least one known defect.

3. The method of claim 1 further including the step of:

compiling historical test data relating to defect attributes existing on at least one die defined upon at least one wafer; and wherein said analyzing step is further defined as including the step of performing an analysis of said historical test data to determine whether prior similar defects had successfully passed testing.

4. The method of claim 1 further including the step of:

compiling historical inspection data relating to defect attributes on at least one die defined on a wafer; and wherein said analyzing step includes an analysis of said historical inspection data to determine whether past similar defects existing on a second die had resulted in rejecting said second die due to fatal defects.

5. The method of claim 4 wherein said inspection data includes at least one of the following attributes: the layer most recently deposited prior to a defect being identified, the size of the defect, the location of the defect, whether the defect is conductive.

6. The method of claim 1 further including the steps of:

compiling historical test data relating to at least one defect attribute on a second die on a second wafer; and compiling historical inspection data relating to at least one defect attribute on said second die; and wherein said analyzing step includes an analysis of said historical inspection data and an analysis of said historical test data.

7. The method of claim 6 wherein said historical inspection data includes at least one of the following attributes: the layer most recently deposited prior to said defect being identified, the size of said defect, the location of the defect, whether said defect is conductive.

8. A method for testing an integrated circuit wafer, the wafer having a first plurality of dice defined thereon, at least one die having at least one known defect, as determined by inspection, the method comprising the steps of:

selecting for testing a first die having a known defect;

analyzing connectivity information and defect information relating to said first die;

determining, based upon said analysis of said connectivity information and said defect information, a probability of failure for each known defect existing on said first die; and ranking, on said first die having a plurality of known defects, each known defect in decreasing probability of failure;

modifying the sequence of tests performed on said first die so that one or more tests directly relating to said known defects are performed in an order corresponding to the results of said ranking step and prior to performing tests which are unrelated to a defect.

9. A method for controlling the testing of an integrated circuit wafer, the wafer having a first plurality of subregions defined thereon, at least one subregion within said plurality of subregions having at least one known defect, as determined by inspection, the method comprising the steps of:

analyzing connectivity information and defect information relating to the at least one subregion having at least one known defect;

determining, based upon said analysis, a probability of failure for each at least one known defect; and rejecting, prior to testing, any of the at least one subregions having at least one known defect if said known defect is determined to have an unacceptably high probability of failure.

10. The method of claim 9 wherein said step of analyzing is further defined as including the steps of:

dynamically extracting net list information for at least one circuit relating to a defect being analyzed; and determining at least one conductive path likely to be impaired by the at least one known defect.

11. The method of claim 9 further including the step of:

compiling historical test data relating to defect attributes existing on at least one die defined upon at least one wafer; and wherein said analyzing step is further defined as including the step of performing an analysis of said historical test data to determine whether prior similar defects had successfully passed testing.

12. The method of claim 9 further including the step of:

compiling historical inspection data relating to defect attributes on at least one die defined on a wafer; and wherein said analyzing step includes an analysis of said historical inspection data to determine whether past similar defects existing on a second die had resulted in rejecting said second die due to fatal defects.

13. The method of claim 12 wherein said inspection data includes at least one of the following attributes: the layer most recently deposited prior to a defect being identified, the size of the defect, the location of the defect, whether the defect is conductive.

14. The method of claim 9 further including the steps of:

compiling historical test data relating to at least one defect attribute on a second die on a second wafer; and compiling historical inspection data relating to at least one defect attribute on said second die; and wherein said analyzing step includes an analysis of said historical inspection data and an analysis of said historical test data.

15. The method of claim 14 wherein said historical inspection data includes at least one of the following attributes: the layer most recently deposited prior to said defect being identified, the size of said defect, the location of the defect, whether said defect is conductive.

* * * * *